(12) United States Patent
Lee et al.

(10) Patent No.: US 11,357,138 B2
(45) Date of Patent: Jun. 7, 2022

(54) COOLING STRUCTURE OF VEHICLE DRIVE INVERTER AND CONTROL SYSTEM OF THE SAME

(71) Applicants: HYUNDAI MOTOR COMPANY, Seoul (KR); KIA MOTORS CORPORATION, Seoul (KR)

(72) Inventors: Sang Shin Lee, Suwon-si (KR); Man Ju Oh, Yongin-si (KR); So La Chung, Seoul (KR); Jae Woong Kim, Hwaseong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 94 days.

(21) Appl. No.: 16/749,375

(22) Filed: Jan. 22, 2020

(65) Prior Publication Data
US 2021/0084798 A1    Mar. 18, 2021

(30) Foreign Application Priority Data
Sep. 18, 2019   (KR) .................... 10-2019-0114904

(51) Int. Cl.
*H05K 7/20* (2006.01)
*H01H 13/18* (2006.01)

(52) U.S. Cl.
CPC ......... *H05K 7/20854* (2013.01); *H01H 13/18* (2013.01)

(58) Field of Classification Search
CPC ........... H05K 7/20254; H05K 7/20509; H05K 7/20854; H05K 7/20881; H05K 7/209; H05K 7/20936
See application file for complete search history.

(56) References Cited

U.S. PATENT DOCUMENTS

| 8,339,785 | B2* | 12/2012 | Chang | H05K 7/20927 |
| --- | --- | --- | --- | --- |
| | | | | 361/699 |
| 10,600,722 | B1* | 3/2020 | Green | H05K 7/209 |
| 2006/0174643 | A1* | 8/2006 | Ostrom | H05K 7/20936 |
| | | | | 62/259.2 |
| 2008/0291630 | A1* | 11/2008 | Monh | H01L 23/427 |
| | | | | 361/700 |
| 2013/0206371 | A1* | 8/2013 | Fujita | H01L 23/473 |
| | | | | 165/104.28 |
| 2015/0040583 | A1* | 2/2015 | Kwak | F28F 3/12 |
| | | | | 62/3.2 |
| 2016/0082861 | A1* | 3/2016 | Gauthier | B60L 11/1874 |
| | | | | 165/287 |
| 2016/0190038 | A1* | 6/2016 | Koyama | H01L 23/3675 |
| | | | | 257/693 |
| 2019/0030984 | A1* | 1/2019 | Zeigler | H05K 7/20881 |

FOREIGN PATENT DOCUMENTS

KR    10-1841284 A    3/2018

* cited by examiner

*Primary Examiner* — Jacob R Crum
(74) *Attorney, Agent, or Firm* — Morgan, Lewis & Bockius LLP (57) ABSTRACT

A cooling structure of a vehicle drive inverter includes: a switching element disposed in the vehicle drive inverter; a heat dissipation fin connected to and heat-exchangeable with the switching element; a cooling flow path in which a coolant flows and heat-exchanges with the heat dissipation fin; and an auxiliary cooling module connected to and heat-exchangeable with the switching element to be heated by a heat generation of the switching element or to be cooled together with the switching element.

11 Claims, 8 Drawing Sheets

FIG. 1

-PRIOR ART-

COOLING STRUCTURE OF VEHICLE DRIVE INVERTER AND CONTROL SYSTEM OF THE SAME

CROSS REFERENCE TO RELATED APPLICATION

The present application claims priority to Korean Patent Application No. 10-2019-0114904, filed on Sep. 18, 2019, the entire contents of which is incorporated herein for all purposes by this reference.

TECHNICAL FIELD

The present disclosure relates to a cooling structure of a vehicle drive inverter which reflects a heat generation property of a switching element included in the inverter and a control system of the same.

BACKGROUND

In recent years, an electric vehicle has emerged as a social issue to implement eco-friendly technology and to solve a problem such as energy depletion. The electric vehicle operates using a motor which receives electricity from a battery to output power. Therefore, the electric vehicle is spotlighted as being eco-friendly since the vehicle has advantages of no carbon dioxide emission, very low noise, and energy efficiency of a motor higher than that of the engine.

This electric vehicle EV or a fuel cell vehicle FCEV uses a motor to drive the vehicle, and an inverter is required for the motor. A heat generation amount of the inverter is smaller than that of the engine, a switching element (e.g. insulated gate bipolar transistor (IGBT)) in the inverter, however, has a heat generation property, i.e. a relatively large change in temperature due to its small heat capacity ($C=c \cdot m$).

However, a prior cooling structure of the inverter uses a control of temperature and flow rate of a coolant cooling the inverter in a manner similar to a cooling structure of the engine. Such a cooling structure is suitable for the engine which has relatively slow heat generation property, but is insufficient to respond to immediate heat generation property of the inverter.

Figure 1:
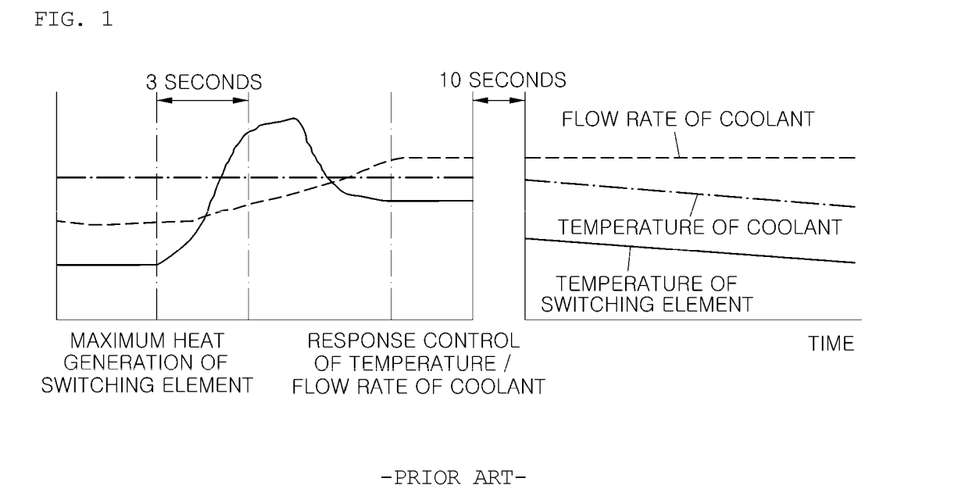
FIG. 1 illustrates a change in temperature of the switching element in a prior cooling structure of the inverter.

FIG. 1 illustrates a change in temperature of the switching element in the prior cooling structure of the inverter.

Referring to FIG. 1, as a load of the motor increases, the switching element starts heat generation and a temperature of the switching element increases rapidly within a very short time.

According to the prior cooling structure of the inverter, a response control of the temperature or flow rate of the coolant has a problem of slow response, and the temperature or flow rate of the coolant is increased after the switching element of the inverter already reaches a high temperature. Accordingly, there is a problem in that the switching element is frequently exposed to the high temperature when the load of the motor is varied.

The contents described as the related art have been provided only to assist in understanding the background of the present disclosure and should not be considered as corresponding to the related art known to those having ordinary skill in the art.

SUMMARY

An object of the present disclosure is to provide a cooling structure of a vehicle drive inverter, which reduces a change in temperature due to a heat generation of a switching element included in the inverter, and a control system of the same.

According to an exemplary embodiment of the present disclosure, a cooling structure of a vehicle drive inverter may include: a switching element disposed in the vehicle drive inverter; a heat dissipation fin connected to and heat-exchangeable with the switching element; a cooling flow path in which a coolant flows and heat-exchanges with the heat dissipation fin; and an auxiliary cooling module connected to and heat-exchangeable with the switching element to be heated by a heat generation of the switching element or to be cooled together with the switching element.

The switching element may have one surface in contact with the heat dissipation fin and the other surface in contact with the auxiliary cooling module.

The auxiliary cooling module may be formed in a shape surrounding the switching element to be connected to and heat-exchangeable with the heat dissipation fin.

The auxiliary cooling module may be an inverter case, and the switching element may be connected to and heat-exchangeable with the inverter case through a first heat conductor positioned between the inverter case and the switching element.

The first heat conductor may have one side in surface contact with the switching element and the other side in surface contact with the inverter case.

The auxiliary cooling module may include therein a refrigerant having a state change temperature within an allowable temperature range of the switching element.

The state change temperature of the refrigerant may be a boiling point of the refrigerant, and the refrigerant may cool the switching element while being evaporated by the heat generation of the switching element.

The refrigerant may have a minimum capacity or more which is calculated based on a latent heat of the refrigerant at the state change, a maximum heat generation amount of the switching element and a cooling response time.

The auxiliary cooling module may be connected to the cooling flow path and heat-exchangeable with the coolant in the cooling flow path through a second heat conductor.

The second heat conductor may have one end connected to the auxiliary cooling module and the other end connected to the cooling flow path, the other end of the second heat conductor being positioned at a downstream point of the heat dissipation fin based on a flow direction of the cooling flow path.

The auxiliary cooling module may include therein a refrigerant having the boiling point within the allowable temperature range of the switching element, and the second heat conductor may have one end connected to the auxiliary cooling module and the other end connected to the cooling flow path, the one end of the second heat conductor being connected to an upper portion of the auxiliary cooling module.

According to another exemplary embodiment of the present disclosure, a control system of the cooling structure of the vehicle drive inverter as described above may include: a circulation pump disposed in the cooling flow path and configured to circulate the coolant in the cooling flow path; a heat exchanger disposed in the cooling flow path and heat-exchanging the coolant in the cooling flow path with outdoor air; a cooling fan configured to rotate for flowing the outdoor air around the heat exchanger; and a controller controlling a rotational speed of the circulation pump or a rotational speed of the cooling fan based on an input signal received from a driver to control drive of a motor.

According to still another exemplary embodiment of the present disclosure, a control system of the cooling structure of the vehicle drive inverter as described above may include: a circulation pump disposed in the cooling flow path and configured to circulate the coolant in the cooling flow path; a heat exchanger disposed in the cooling flow path and heat-exchanging the coolant in the cooling flow path with the outdoor air; a cooling fan configured to rotate for flowing the outdoor air around the heat exchanger; and a controller controlling a rotational speed of the circulation pump or a rotational speed of the cooling fan based on a pressure in the auxiliary cooling module.

DETAILED DESCRIPTION OF THE EMBODIMENTS

Specific descriptions on structure and function of exemplary embodiments of the present disclosure described herein are merely illustrative and not construed to limit the disclosure thereto.

Since the present disclosure may be variously modified and have several exemplary embodiments, specific exemplary embodiments will be shown in the accompanying drawings and be described in detail. However, it is to be understood that the present disclosure is not limited to the specific exemplary embodiments, but includes all modifications, equivalents, and substitutions included in the spirit and the scope of the present disclosure.

Terms such as 'first', 'second', etc., may be used to describe various components, but the components are not to be construed as being limited to the terms. The terms are used only to distinguish one component from another component. For example, the 'first' component may be named the 'second' component and the 'second' component may also be similarly named the 'first' component, without departing from the scope of the present disclosure.

It is to be understood that when one element is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween. Other expressions describing a relationship between components, that is, "between," "directly between," "neighboring to," "directly neighboring to" and the like, should be similarly interpreted.

Terms used in the present specification are used only in order to describe specific exemplary embodiments rather than limiting the present disclosure. Singular forms used herein are intended to include plural forms unless explicitly indicated otherwise. It will be further understood that the terms "comprise" or "have" used in this specification, specify the presence of stated features, steps, operations, components, parts, or a combination thereof, but do not preclude the presence or addition of one or more other features, numerals, steps, operations, components, parts, or a combination thereof.

Unless indicated otherwise, it is to be understood that all the terms used in the specification including technical and scientific terms has the same meaning as those that are understood by those who skilled in the art. It must be understood that the terms defined by the dictionary are identical with the meanings within the context of the related art, and they should not be ideally or excessively formally defined unless the context clearly dictates otherwise.

Hereinafter, exemplary embodiments of the present disclosure will be described in detail with reference to the accompanying drawings. Like reference numerals denote like components throughout the drawings.

Figure 2:
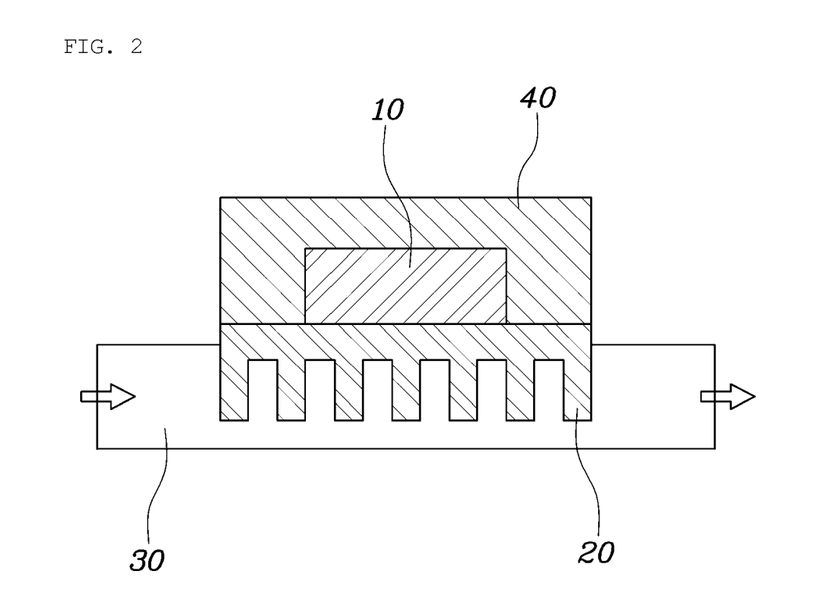
FIGS. 2 to 4 are configuration diagrams illustrating a cooling structure of a vehicle drive inverter according to various exemplary embodiments of the present disclosure.
Figure 3:
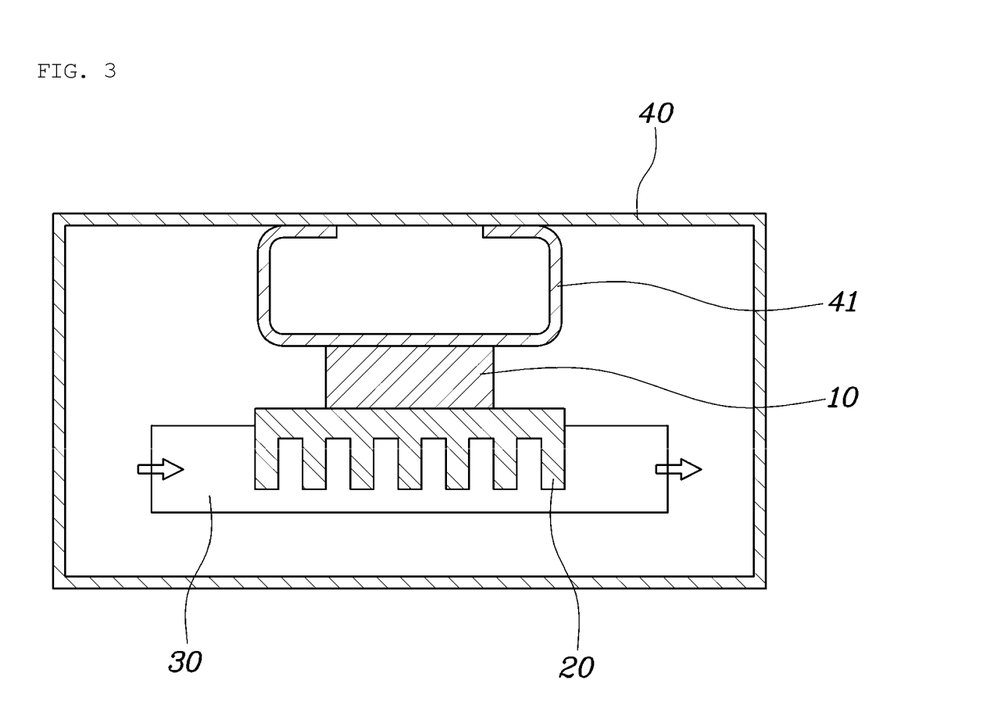
Figure 4:
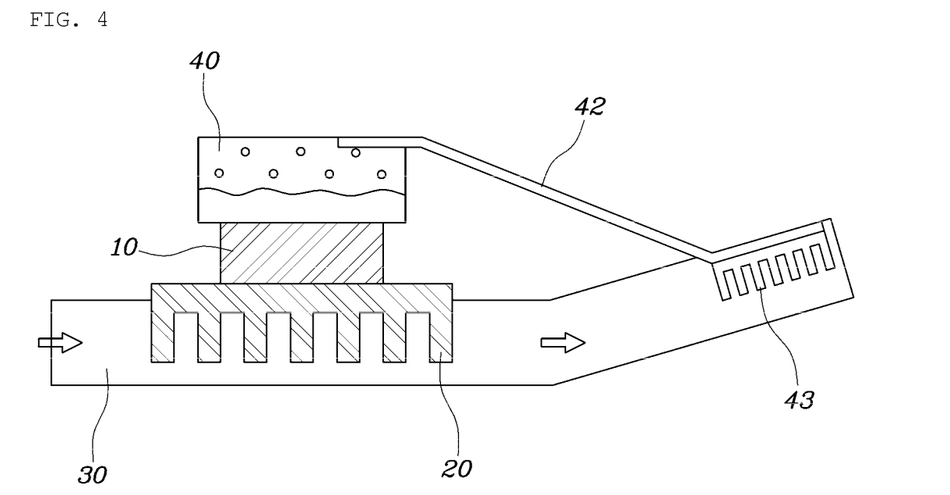

FIGS. 2 to 4 are configuration diagrams illustrating a cooling structure of a vehicle drive inverter according to various exemplary embodiments of the present disclosure.

Referring to FIGS. 2 to 4, a cooling structure of a vehicle drive inverter may include: a switching element 10 positioned in the vehicle drive inverter; a heat dissipation fin 20 connected to and heat-exchangeable with the switching element 10; a cooling flow path 30 in which a coolant flows and heat-exchanges with the heat dissipation fin 20; and an auxiliary cooling module 40 connected to and heat-exchangeable with the switching element 10 to be heated by a heat generation of the switching element 10 or to be cooled together with the switching element 10.

The switching element 10 is an element positioned in the inverter and may be a semiconductor element such as a transistor or a thyristor. In an exemplary embodiment, the switching element 10 may be a metal oxide semiconductor field effect transistor (MOSFET) or an insulated gate bipolar transistor (IGBT).

The heat dissipation fin 20 may be connected to and heat-exchangeable with the switching element 10. The heat dissipation fin 20 may be connected to the switching element 10 to be in direct contact and heat-exchangeable with the switching element 10 through conduction or the like, or to be in indirect contact and heat-exchangeable with the switching element 10 using a separate medium.

The coolant may flow in the cooling flow path 30, and the heat dissipation fin 20 may be entirely positioned in the cooling flow path 30 or may be inserted into the cooling flow path 30 so that the heat dissipation fin 20 is partially exposed to the coolant.

The auxiliary cooling module 40 may be connected to and heat-exchangeable with the switching element 10. In particular, the auxiliary cooling module 40 may be heated by the heat generation of the switching element 10, or may be cooled together with the switching element 10. As in an exemplary embodiment to be described below, the auxiliary cooling module 40 may be integrally coupled to the switching element 10 or indirectly connected to the switching element 10 by a separate medium.

A heat capacity of the switching element 10 may be increased by the auxiliary cooling module 40 coupled to and heat-exchangeable with the switching element 10, thereby delaying a temperature increase of the switching element 10 due to the heat generation.

In an exemplary embodiment, as illustrated in FIG. 2, the auxiliary cooling module 40 may be formed in a shape surrounding the switching element 10, and may be connected to and heat-exchangeable with the heat dissipation fin 20.

The auxiliary cooling module 40 may simply be a mass having a large heat capacity. The auxiliary cooling module 40 may have the heat capacity larger than that of the switching element 10. The auxiliary cooling module 40 may be connected to and heat-exchangeable with not only the switching element 10 but also the heat dissipation fin 20. Accordingly, the auxiliary cooling module 40 heated by the heat generation of the switching element 10 may be cooled by the heat dissipation fin 20.

In another exemplary embodiment, as illustrated in FIGS. 3 and 4, the switching element 10 may have one surface in contact with the heat dissipation fin 20 and the other surface in contact with the auxiliary cooling module 40. The switching element 10 may be in direct contact and heat-exchangeable with the heat dissipation fin 20 through conduction, and may be in direct contact and heat-exchangeable with the auxiliary cooling module 40 through conduction, on the other surface opposite to the one surface on which the switching element 10 is in contact with the heat dissipation fin 20.

The auxiliary cooling module 40 may not be directly connected to the heat dissipation fin 20, but may include a separate medium for cooling the auxiliary cooling module 40, may be indirectly cooled through the switching element 10 or may be cooled by ambient outdoor air.

In particular, as illustrated in FIG. 3, the auxiliary cooling module 40 may be an inverter case 40, and the switching element 10 may be connected to and heat-exchangeable with the inverter case 40 through a first heat conductor 41 positioned between the inverter case 40 and the switching element 10.

The inverter case 40 may be configured to surround the switching element 10 and the auxiliary cooling module 40 from the outside. The first heat conductor 41 may be made of a material having relatively high heat conductivity (for example, a metal such as copper).

The first heat conductor 41 may have one side in surface contact with the switching element 10 and the other side in surface contact with the inverter case. The first heat conductor 41 may be in surface contact with the switching element 10 and the inverter case, respectively, and thus may have improved heat conductivity.

In another exemplary embodiment, as illustrated in FIG. 4, the auxiliary cooling module 40 may include therein a refrigerant having a state change temperature within an allowable temperature range of the switching element 10.

Here, the refrigerant may be a two-phase refrigerant using a latent heat by a state change. That is, the state change temperature of the refrigerant may be within the allowable temperature range of the switching element 10.

The allowable temperature range of the switching element 10 may be preset to a range of an upper limit temperature (e.g. 140° C.) or below in which a durability of the switching element 10 deteriorates sharply as being exposed. In an exemplary embodiment, the state change temperature of the refrigerant may be about 80° C.

The state change temperature of the refrigerant may be a boiling point of the refrigerant, and the refrigerant may cool the switching element 10 while being evaporated by the heat generation of the switching element 10.

That is, the refrigerant may have the boiling point within the allowable temperature range of the switching element 10. Accordingly, when the switching element 10 is heated within the allowable temperature range, the refrigerant may be evaporated and cool the switching element 10 by its latent heat.

The refrigerant may have a minimum capacity or more which is calculated based on the latent heat of the refrigerant at the state change, a maximum heat generation amount of the switching element 10, and a cooling response time.

For example, a required heat amount of the refrigerant may be calculated as the product of the maximum heat generation amount of the switching element 10 and the cooling response time. The minimum capacity of the refrigerant may be calculated by dividing the latent heat (latent heat per unit mass) of the refrigerant from the required heat amount of the refrigerant.

Here, the cooling response time may be preset in consideration of a responsiveness of a cooling control through the cooling flow path 30 when the heat generation of the switching element 10 occurs. That is, the cooling response time may be between a time point when the heat generation of the switching element 10 is varied and a time point when the cooling control through the cooling flow path 30 is varied, for example, may be preset to 10 seconds.

The auxiliary cooling module 40 may be arranged so as to be heat-exchangeable with the coolant in the cooling flow path 30 through a second heat conductor 42.

That is, the auxiliary cooling module 40 may be arranged so as to be heat-exchangeable with the coolant through the second heat conductor 42, and thus may be cooled by the coolant separately from the switching element 10.

In particular, the second heat conductor 42 may have one end connected to the auxiliary cooling module 40 and the other end connected to the cooling flow path 30, the other end of the second heat conductor 42 being positioned at a downstream point of the heat dissipation fin 20 based on a flow direction in the cooling flow path 30.

The other end of the second heat conductor 42 may be connected to the cooling flow path 30 to be located downstream from the heat dissipation fin 20 based on the coolant flow direction in the cooling flow path 30 to receive a minimal impact from cooling of the heat dissipation fin 20. A cooling fin 43 may be folioed on the other end of the second heat conductor 42 to extend an area in contact with the coolant in the cooling flow path 30.

In addition, the auxiliary cooling module 40 may include therein a refrigerant having the boiling point within the allowable temperature range of the switching element 10, and the second heat conductor 42 may have one end connected to the auxiliary cooling module 40 and the other end connected to the cooling flow path 30, the one end of the second heat conductor 42 being connected to an upper portion of the auxiliary cooling module 40.

The one end cooled by the other end of the second heat conductor 42 may be connected to the upper portion of the auxiliary cooling module 40 to cool the upper portion of the auxiliary cooling module 40. Accordingly, it is possible to condense the refrigerant in a gaseous state which is evaporated in the auxiliary cooling module 40 and positioned in the upper portion of the auxiliary cooling module 40.

Figure 5:
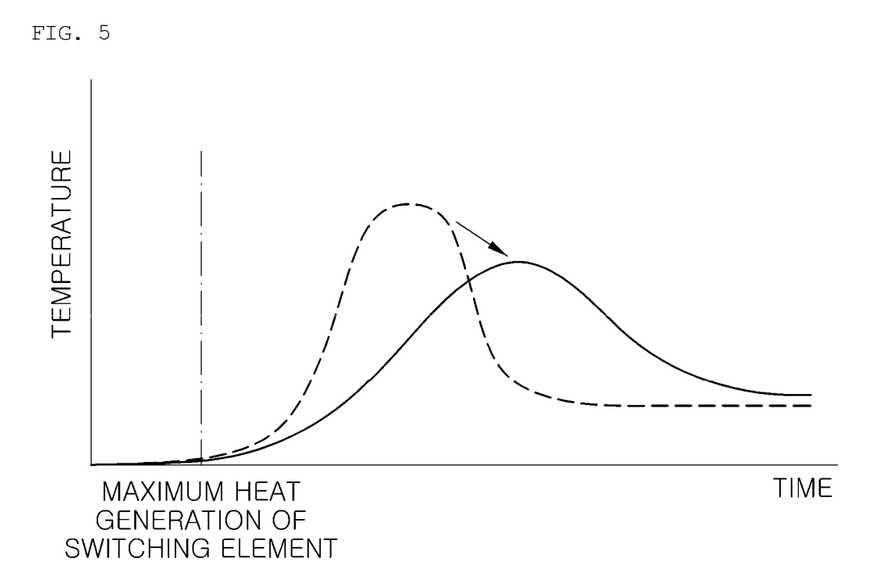
FIG. 5 illustrates a change in temperature of a switching element included in a cooling structure of a vehicle drive inverter according to an exemplary embodiment of the present disclosure.

FIG. 5 illustrates a change in temperature of a switching element included in a cooling structure of a vehicle drive inverter according to an exemplary embodiment of the present disclosure.

Referring to FIG. 5 further, in the cooling structure of the vehicle drive inverter according to the exemplary embodiment of the present disclosure, the change in temperature of the switching element 10 may be delayed and a temperature change amount may be reduced.

In particular, compared to a change in temperature (dotted line) of the switching element 10 according to the prior art, the change in temperature (solid line) of the switching element 10 according to the cooling structure of the vehicle drive inverter in an exemplary embodiment of the present disclosure has an effect that a maximum temperature Tmax of the switching element 10 is decreased as magnitude of a temperature change amount ΔT is decreased and a temperature increase rate of the switching element 10 is reduced to increase time Δt for reaching the maximum temperature of the switching element 10.

Figure 6:
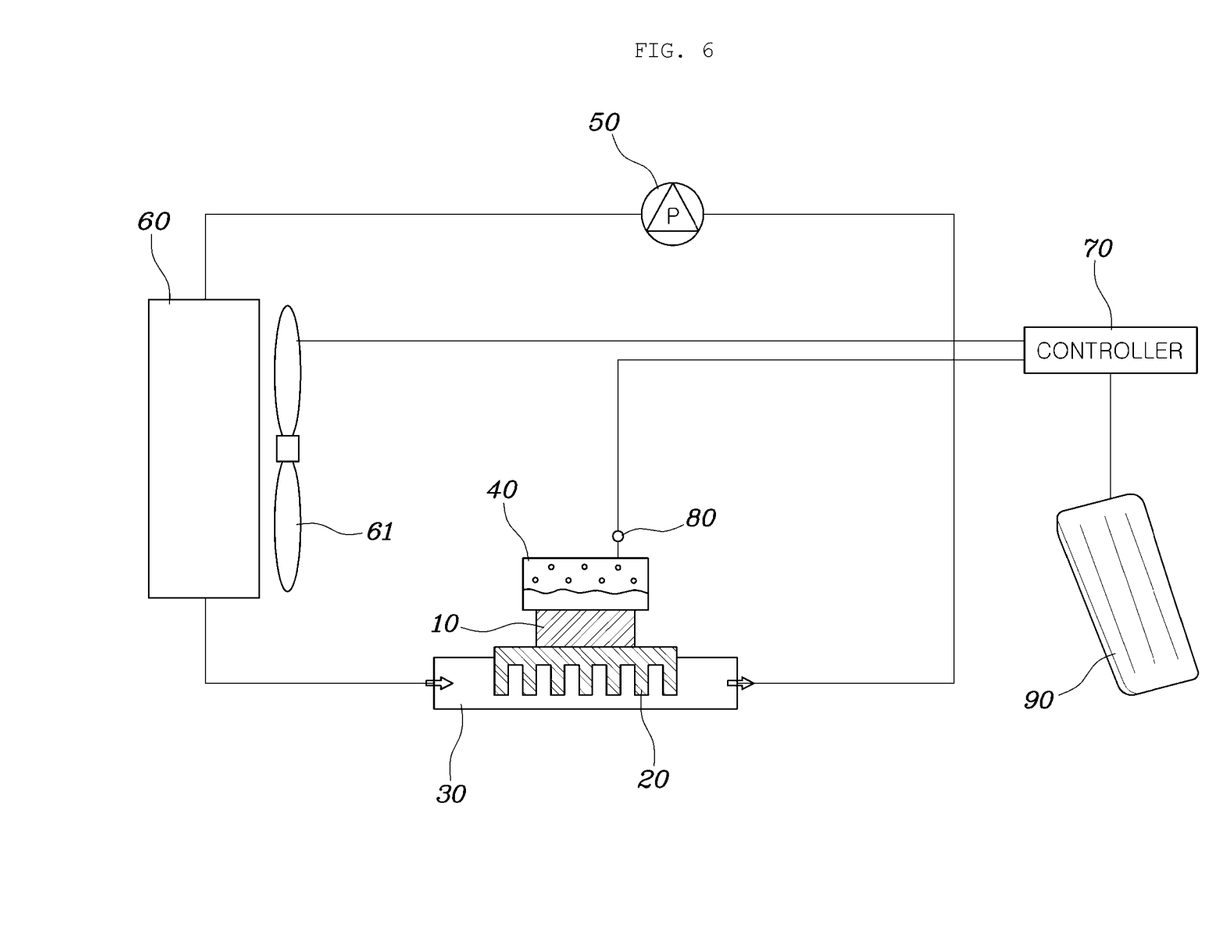
FIG. 6 is a configuration diagram of a control system of a cooling structure of a vehicle drive inverter according to an exemplary embodiment of the present disclosure.
Figure 7:
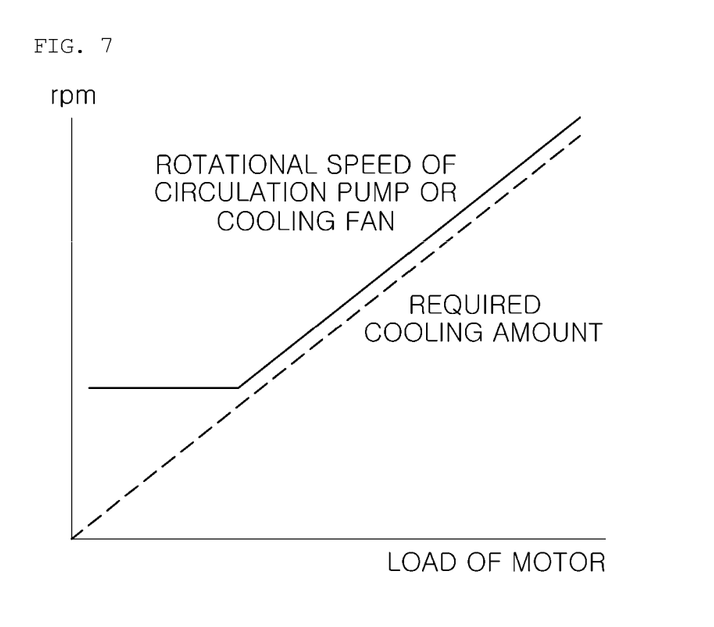
FIGS. 7 and 8 illustrate maps showing rotational speeds of a circulation pump and a cooling fan according to an exemplary embodiment of the present disclosure.
Figure 8:
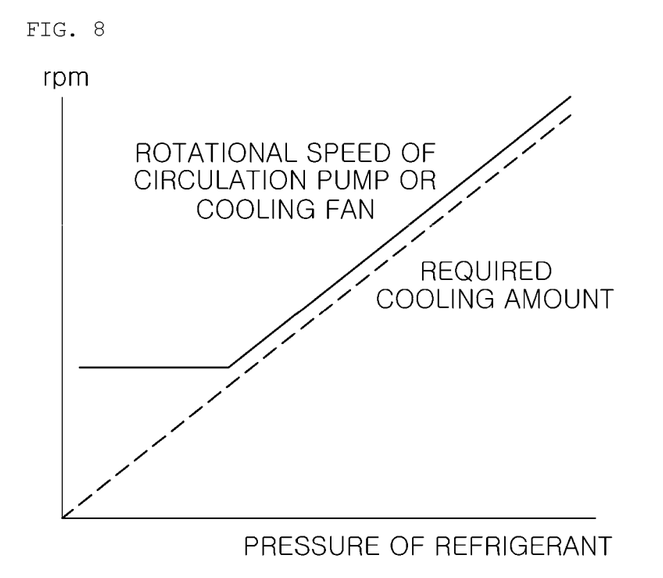

FIG. 6 is a configuration diagram of a control system of a cooling structure of a vehicle drive inverter according to an exemplary embodiment of the present disclosure; and FIGS. 7 and 8 illustrate maps showing rotational speeds of a circulation pump 50 and a cooling fan according to an exemplary embodiment of the present disclosure.

Referring to FIGS. 6 to 8, a control system of the cooling structure of the vehicle drive inverter according to another exemplary embodiment of the present disclosure may include: a circulation pump 50 provided in the cooling flow path 30 and circulating the coolant in the cooling flow path 30 as driven; a heat exchanger 60 provided in the cooling flow path 30 and heat-exchanging the coolant in the cooling flow path 30 with the outdoor air; a cooling fan 61 flowing the outdoor air around the heat exchanger 60 as rotated; and a controller 70 controlling a rotational speed of the circulation pump 50 or that of the cooling fan 61 based on an input signal received from a driver to control drive of a motor.

The input signal may be a signal received from the driver. In an exemplary embodiment, the input signal may be a depression amount of an accelerator pedal 90 operated by the driver. The controller 70 may control the rotational speed of the circulation pump 50 or that of the cooling fan 61 based on an accelerator position sensor (APS) indicating the depression amount of the accelerator pedal 90, which is received from the accelerator pedal 90.

Referring to FIG. 7 further, in an exemplary embodiment, the load of the motor (or the depression amount of the accelerator pedal 90) may be proportional to a required cooling amount of the switching element 10. Therefore, the rotational speed of the circulation pump 50 or that of the cooling fan 61 may be controlled to follow the required cooling amount of the switching element 10 which is increased as the load of the motor is increased. However, the rotational speed of the circulation pump 50 or that of the cooling fan 61 may be controlled to maintain a constant value when the motor has a preset load or less.

Assuming that the load of the motor is proportional to the depression amount of the accelerator pedal 90, the rotational speed of the circulation pump 50 or that of the cooling fan 61 may be controlled to be directly proportional to the depression amount of the accelerator pedal 90.

This control system may control the heat generation of the switching element 10 to be quickly detected and responded, thereby preventing the temperature of the switching element 10 from rising to a high temperature. In this manner, the control system may have an improved responsiveness.

According to another exemplary embodiment of the present disclosure, a control system of the cooling structure of the vehicle drive inverter may include: a controller 70 controlling the rotational speed of the circulation pump 50 or that of the cooling fan 61 based on a pressure in the auxiliary cooling module 40.

The auxiliary cooling module 40, which includes therein the refrigerant having a state change temperature within the allowable temperature range of the switching element 10, may further include a pressure sensor 80 measuring the pressure therein. The controller 70 may control the rotational speed of the circulation pump 50 or that of the cooling fan 61 based on the pressure in the auxiliary cooling module 40, which is measured by a pressure sensor 80.

As being heat-exchanged with the switching element 10 by the heat generation of the switching element 10, the refrigerant may be evaporated in the auxiliary cooling module 40, and as a vapor pressure of the refrigerant is increased, the pressure in the auxiliary cooling module 40 may be increased.

Referring to FIG. 8 further, as the pressure in the auxiliary cooling module 40 is increased, the required cooling amount of the switching element 10 may be increased, and the rotational speed of the circulation pump 50 or that of the cooling fan 61 may be controlled to follow the required cooling amount. However, the rotational speed of the circulation pump 50 or that of the cooling fan 61 may be controlled to maintain a constant value when the motor has the preset load or less.

According to this control system, the evaporated refrigerant may be rapidly condensed to prepare for the heat generation of the switching element 10 which may occur afterward. In this manner, the control system may have a strongly improved cooling control.

The controller 70 according to an exemplary embodiment of the present disclosure may be implemented through a non-volatile memory (not illustrated) configured to store data related to an algorithm configured to control operations of various components of the vehicle or a software instruction for reproducing the algorithm and a processor (not illustrated) configured to perform operations described below using data stored in a corresponding memory. Here, the memory and the processor may be implemented as separate chips, respectively. Alternatively, the memory and the processor may be implemented as a single chip integrated with each other. The processor may be folioed of one or more processors.

According to the cooling structure of the vehicle drive inverter and the control system of the same in the present disclosure, the switching element included in the inverter may have an increased heat capacity.

Accordingly, the switching element may have improved durability by preventing a sudden change in temperature of the switching element.

In addition, the heat generation of the switching element may be detected in advance and the cooling control of the inverter may be controlled to quickly respond thereto.

Although the present disclosure has been shown and described with respect to specific embodiments, it is apparent to those having ordinary skill in the art that the present disclosure may be variously modified and altered without departing from the spirit and scope of the present disclosure as defined by the following claims.

What is claimed is:

1. A cooling structure of a vehicle drive inverter, the cooling structure comprising:
 a switching element disposed in the vehicle drive inverter;
 a heat dissipation fin connected to, and configured to be heat-exchangeable with, the switching element;

a cooling flow path in which a coolant flows to be heat-exchangeable with the heat dissipation fin; and an auxiliary cooling module connected to and heat-exchangeable with the switching element to be heated by a heat generation of the switching element or to be cooled together with the switching element, wherein the auxiliary cooling module includes therein a refrigerant having a state change temperature within an allowable temperature range of the switching element, and wherein the refrigerant has a minimum capacity or more which is calculated based on a latent heat of the refrigerant at a state change, a maximum heat generation amount of the switching element, and a cooling response time.

2. The cooling structure of claim 1, wherein the switching element has a first surface in contact with the heat dissipation fin and a second surface in contact with the auxiliary cooling module.

3. The cooling structure of claim 1,
wherein the auxiliary cooling module has a shape surrounding the switching element, and is connected to and heat-exchangeable with the heat dissipation fin.

4. The cooling structure of claim 1, wherein the auxiliary cooling module is configured as an inverter case, and
wherein the switching element is connected to and heat-exchangeable with the inverter case through a first heat conductor positioned between the inverter case and the switching element.

5. The cooling structure of claim 4, wherein the first heat conductor has a first side in surface contact with the switching element and a second side in surface contact with the inverter case.

6. The cooling structure of claim 1, wherein the state change temperature of the refrigerant is a boiling point of the refrigerant, and
wherein the refrigerant cools the switching element while being evaporated by the heat generation of the switching element.

7. The cooling structure of claim 1, wherein the auxiliary cooling module is heat-exchangeable with the coolant in the cooling flow path through a second heat conductor.

8. The cooling structure of claim 7,
wherein the second heat conductor has a first end connected to the auxiliary cooling module and a second end connected to the cooling flow path, the second end of the second heat conductor being arranged at a downstream point of the heat dissipation fin based on a flow direction of the cooling flow path.

9. The cooling structure of claim 7, wherein the auxiliary cooling module includes therein a refrigerant having a boiling point within the allowable temperature range of the switching element, and the second heat conductor has a first end connected to the auxiliary cooling module and a second end connected to the cooling flow path, the first end of the second heat conductor being connected to an upper portion of the auxiliary cooling module.

10. A control system of the cooling structure of the vehicle drive inverter of claim 1, the control system comprising:
a circulation pump disposed in the cooling flow path and configured to circulate the coolant in the cooling flow path;
a heat exchanger disposed in the cooling flow path and heat-exchanging the coolant in the cooling flow path with outdoor air;
a cooling fan configured to rotate for flowing the outdoor air around the heat exchanger; and
a controller controlling a rotational speed of the circulation pump or a rotational speed of the cooling fan based on an input signal received from a driver to control drive of a motor.

11. A control system of a cooling structure of a vehicle drive inverter, the control system including:
the cooling structure comprising:
a switching element disposed in the vehicle drive inverter;
a heat dissipation fin connected to, and configured to be heat-exchangeable with, the switching element;
a cooling flow path in which a coolant flows to be heat exchangeable with the heat dissipation fin; and
an auxiliary cooling module connected to and heat exchangeable with the switching element to be heated by a heat generation of the switching element or to be cooled together with the switching element,
wherein the auxiliary cooling module includes therein a refrigerant having a state change temperature within an allowable temperature range of the switching element, and
wherein the control system further includes:
a circulation pump disposed in the cooling flow path and configured to circulate the coolant in the cooling flow path;
a heat exchanger disposed in the cooling flow path and heat-exchanging the coolant in the cooling flow path with the outdoor air;
a cooling fan configured to rotate for flowing the outdoor air around the heat exchanger; and
a controller controlling a rotational speed of the circulation pump or a rotational speed of the cooling fan based on a pressure in the auxiliary cooling module.

* * * * *